(12) United States Patent
Javora et al.

(10) Patent No.: US 9,696,345 B2
(45) Date of Patent: Jul. 4, 2017

(54) VOLTAGE MEASUREMENT DEVICE WITH AN INSULATING BODY

(71) Applicant: ABB TECHNOLOGY AG, Zürich (CH)

(72) Inventors: Radek Javora, Brno (CZ); Jaromir Podzemny, Brno (CZ); David Raschka, Ivancice (CZ); Marek Pavlas, Otnice (CZ); Petr Velesik, Brno (CZ)

(73) Assignee: ABB Schweiz AG, Baden (CH)

( * ) Notice: Subject to any disclaimer, the term of this patent is extended or adjusted under 35 U.S.C. 154(b) by 185 days.

(21) Appl. No.: 14/611,532

(22) Filed: Feb. 2, 2015

(65) Prior Publication Data
US 2015/0145502 A1 May 28, 2015

Related U.S. Application Data

(60) Provisional application No. PCT/EP2013/002277, filed on Jul. 31, 2013.

(30) Foreign Application Priority Data

Aug. 3, 2012 (EP) .................................... 12005658

(51) Int. Cl.
G01R 1/18 (2006.01)
G01R 15/04 (2006.01)
G01R 19/00 (2006.01)

(52) U.S. Cl.
CPC .............. *G01R 1/18* (2013.01); *G01R 15/04* (2013.01); *G01R 19/0084* (2013.01)

(58) Field of Classification Search
CPC combination set(s) only.
See application file for complete search history.

(56) References Cited

U.S. PATENT DOCUMENTS 3,829,742 A * 8/1974 Muller ................... G01R 15/16
174/28
3,835,353 A * 9/1974 Hermstein ............. G01R 15/16
361/303

(Continued)

FOREIGN PATENT DOCUMENTS

CN 2689243 Y 3/2005
EP 0 510 427 A2 10/1992

OTHER PUBLICATIONS

International Search Report (PCT/ISA/210) mailed on Oct. 9, 2013, by the European Patent Office as the International Searching Authority for International Application No. PCT/EP2013/002277.

(Continued)

*Primary Examiner* — Clayton E Laballe
*Assistant Examiner* — Jas Sanghera
(74) *Attorney, Agent, or Firm* — Taft Stettinius & Hollister LLP

(57) ABSTRACT

A voltage measurement device includes an insulating body, for the use in medium- or high-voltage equipment or switchgears The insulating body includes an impedance divider having at least one high voltage impedance and at least one low voltage impedance in series, and with shielding electrodes. In order to optimize the circuit design for voltage measurement design in a given application and prevent the risk of malfunction when the same device it is used in multiple applications or at severe environmental or operating conditions, the device includes at least one high-voltage shielding electrode and/or at least one low-voltage shielding electrode which dimensions together establish a physical length of the impedance divider. The shielding electrodes surround the high and/or low voltage impedances, which provide a specified voltage division ratio and which are (Continued)

located inside or outside of the insulating body. An output of the impedance divider is connected to a shielded cable.

12 Claims, 4 Drawing Sheets

(56) References Cited

U.S. PATENT DOCUMENTS

| | | | | |
|---|---|---|---|---|
| 3,839,695 A * | 10/1974 | Julie | .................. | H03K 3/53 |
| | | | | 338/64 |
| 6,005,213 A * | 12/1999 | Morita | ................. | H01H 33/664 |
| | | | | 218/118 |
| 2008/0251270 A1* | 10/2008 | Lee | .................... | H01B 11/1817 |
| | | | | 174/105 R |
| 2008/0314636 A1* | 12/2008 | Ogura | ................ | H01B 11/1895 |
| | | | | 174/350 |

OTHER PUBLICATIONS

Written Opinion (PCT/ISA/237) mailed on Oct. 9, 2013, by the European Patent Office as the International Searching Authority for International Application No. PCT/EP2013/002277.

European Search Report mailed on Jan. 23, 2013 for Application No. 12005658.5.

\* cited by examiner

STATE OF THE ART

VOLTAGE MEASUREMENT DEVICE WITH AN INSULATING BODY

RELATED APPLICATION(S)

This application claims priority under 35 U.S.C. §120 to International application PCT/EP2013/002277 filed on Jul. 31, 2013, designating the U.S, and claiming priority to European application 12005658.5 filed in Europe on Aug. 3, 2012. The entire content of each prior application is hereby incorporated by reference.

FIELD

The present disclosure is related to a voltage measurement device with an insulating body, for the use in medium or high voltage equipment or switchgears.

BACKGROUND INFORMATION

Voltage measurement devices for medium and high voltage applications use resistive and/or capacitive dividers for voltage measurement and/or for protection purposes of switchgear arrangements, for example. Such devices, which operate at medium or at high voltage levels, can be exposed to a strong electric field which, being placed in close proximity, can influence measured quantities mainly in case of low-power outputs or introduce high dielectric stress on insulating material or on a surface of such equipment. In case of outdoor installations and under humid conditions, further influences could be observed, which can change electric field distribution thus causing error to measured voltage level or causing corona on the surface of devices or increased partial discharge level within devices.

FIG. 2 illustrates a voltage divider in accordance with a prior art implementation. The voltage divider includes an insulating body, which houses high voltage impedance that is connected to high voltage impedance at one end and to low-voltage impedance at the other end. Low-voltage impedance should be connected to the ground. Output of such impedance divider is done via two wires and/or a cable.

The prior art arrangement is subject to a higher susceptibility to parasitic capacitances and probability to change the accuracy of a measured voltage, which can lead to inaccurate values for protection and/or measurement purposes occurs.

SUMMARY

An exemplary voltage measurement device with an insulating body, for use in medium- or high-voltage equipment or switchgears is disclosed, comprising: an impedance divider including at least one high-voltage impedance, at least one low-voltage impedance, and shielding electrodes, wherein the at least one high-voltage impedance and the at least one low-voltage impedance are connected in series, provide a specified voltage division ratio, and together establish a physical length of the impedance divider, wherein the shielding electrodes includes at least one of: one or more high voltage shielding electrodes; and one or more low voltage shielding electrodes, wherein the shielding electrodes are arranged to surround at least one of: the at least one high voltage impedance and the at least one low voltage impedance, and wherein an output of the impedance divider is connected to a shielded cable.

DETAILED DESCRIPTION OF THE DRAWINGS

The subject matter of the disclosure will be explained in more detail in the following text with reference to preferred exemplary embodiments which are illustrated in the attached drawings, in which.

DETAILED DESCRIPTION

Figure 1:
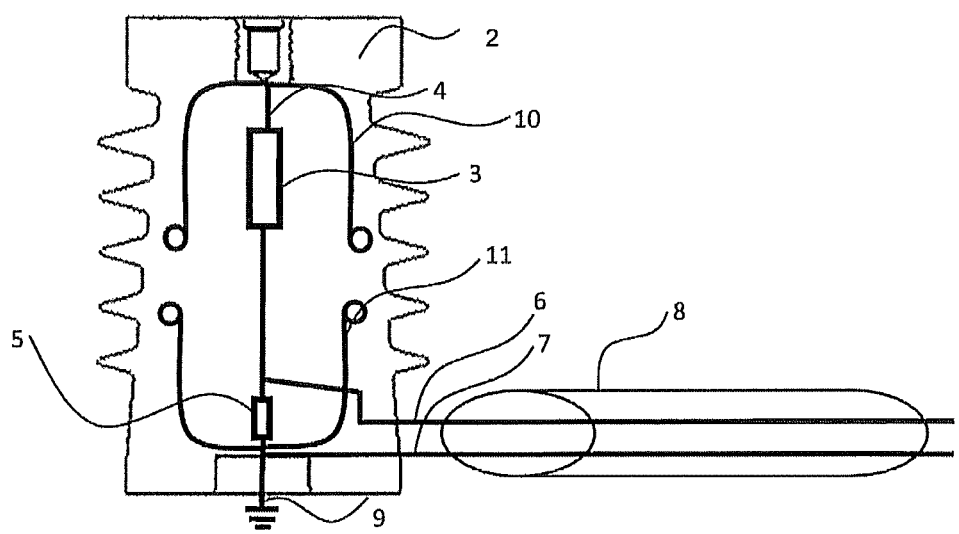
FIG. 1 illustrates an impedance divider in accordance with an exemplary embodiment of the present disclosure.
Figure 2:
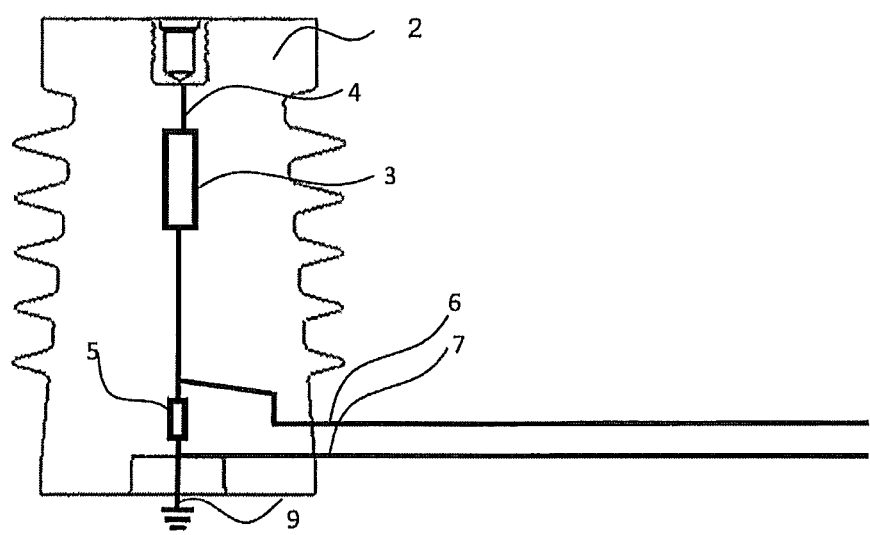
FIG. 2 illustrates a voltage divider in accordance with a prior art implementation.

Exemplary embodiments of the present disclosure provide a voltage sensor that reduces and/or eliminates the risk of malfunction in an event the same device is used in another application or at severe environmental or operating conditions.

Exemplary embodiments of the present disclosure include at least one high-voltage shielding electrode and/or at least one low-voltage shielding electrode which dimensions considered together can establish a physical length of an impedance divider, and that the shielding electrodes surround the high- and/or low-voltage impedances providing a specified voltage division ratio, and which can be located either inside or outside of the insulating body for distributing the electric field in the best way and reduce electric field stress either inside or outside of the said device. The output of the impedance divider is connected to a shielded cable of the voltage sensor.

Exemplary embodiments of the present disclosure include a combination of features in which a functional cooperation leads to a better accuracy of voltage measurement in medium and/or high voltage use.

According to an exemplary embodiment of the present disclosure the shielding electrodes can be in ring or bell shapes, having roundings at the edges with radius of at least 0.5 mm.

According to another exemplary embodiment, the internal shielding electrodes can be longer than the physical length of impedances they protect.

According to yet another exemplary embodiment of the present disclosure, the internal shielding electrodes can be located at a minimum of 1 mm from the surface of the insulating body. It should be understood that the shielding electrodes are located within the insulating body.

According to an exemplary embodiment disclosed herein, the distance of the shielding electrodes from the impedance divider is larger than a dielectric withstand of used insulating material for a given voltage level under which the impedances can be operating.

According to another exemplary embodiment of the present disclosure, the distance between the two shielding electrodes is larger than a dielectric withstand of used insulating material for a given voltage level which occurs in an area between said electrodes.

According to an exemplary embodiment of the present disclosure, the impedance divider is either a resistive divider, or capacitive divider, or combination of both.

According to yet another exemplary embodiment disclosed herein, the shielded cable is a twisted pair and/or double shielded cable, in order to achieve the best electric and magnetic field immunity for output cable from the device.

According to an exemplary embodiment of the present disclosure, the shielded cable is a coaxial cable with sufficient performance in order to reduce costs of the whole device.

According to yet another exemplary embodiment disclosed herein, the insulating body accommodating capacitive electrodes is created by a known insulator used by voltage detecting systems and only external shielding electrodes can be used in this case.

According to an exemplary embodiment disclosed herein, the insulating body can have a shape and/or functionality of post insulator, or bushing or cable plug or it can be designed as a stand-alone voltage measurement module to be integrated into other devices.

According to another exemplary embodiment of the present disclosure, the shielding electrodes can be any of a plurality of shapes which can be suitable for use as resistive dividers, and according to known rules and principles could be adapted for use as capacitive dividers as well as capacitive-resistive dividers.

FIG. 1 illustrates an impedance divider in accordance with an exemplary embodiment of the present disclosure. As shown in FIG. 1, insulating body 2 accommodates high-voltage impedance 3 which is connected at one end to a high voltage by connection 4 and at the other end to low-voltage impedance 5. Both the high-voltage impedance 3 and low-voltage impedance 5 form a voltage divider with a given division ratio. The voltage divider is grounded through connection 9 and output wires 6 and 7 go through the cable 8 which is shielded in order to minimize the effects of an external field on a low-voltage signal going through the wires 6 and 7.

In order to reduce capacitive pick-up (e.g., interference) from external voltage sources or fields, shielding electrodes can be used. FIG. 1 shows upper-shielding electrode 10 which protect the high-voltage impedance 3 from external influences and the lower-shielding electrode 11 which protects the low-voltage impedance 5 from external influences.

Apart from external influences, shielding electrodes 10 and 11 improve electric field distribution on a surface of the insulating body 2 or within the insulating body, thus providing a higher dielectric withstand of the device.

The use of shielding electrodes minimizes sensitivity of the voltage divider towards external connections to high-voltage or to other surrounding devices connected to high potential.

According to an exemplary embodiment disclosed herein, external influences during impedance measurement could be minimized by providing improved electric field distribution within the insulating body and on its surface. According to another exemplary embodiment external influences can be minimized with respect to connected equipment could be achieved by following certain positioning and dimensioning (e.g., position and shape) rules for shielding electrodes.

Figure 3:
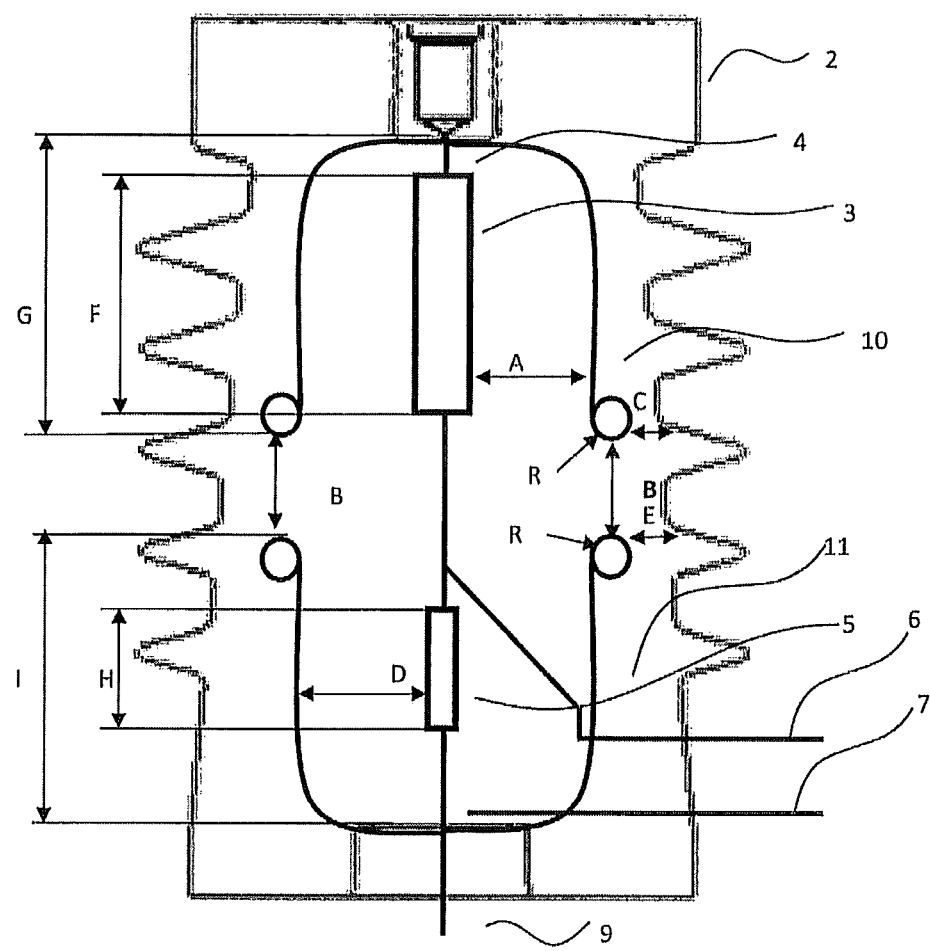
FIG. 3 illustrates a voltage sensor including an internal electrode arrangement in accordance with an exemplary embodiment of the present disclosure.

FIG. 3 illustrates a voltage sensor including an internal electrode arrangement in accordance with an exemplary embodiment of the present disclosure. As shown in FIG. 3, a length G of the upper shielding electrode 10 should be bigger (e.g., larger) than the length F of the high-voltage impedance 3 in order to sufficiently shield the whole high-voltage impedance from external influences. Further, length I of the lower shielding electrode 11 should be bigger (e.g., larger) than the size H of the low-voltage impedance 5 in order to sufficiently shield the whole low-voltage impedance from external influences.

In addition, a distance A of the upper shielding electrode 10 from the high-voltage impedance 3 should be bigger than a dielectric withstand of used insulating material for a given voltage level under which the device is operating or being tested according to relevant standards. A distance D of the lower shielding electrode 11 from the low-voltage impedance 5 should be bigger than a dielectric withstand of used insulating material for a given voltage level at a low-voltage impedance side. Further, a distance B of the upper shielding electrode 10 from the lower shielding electrode 11 should be bigger than a dielectric withstand of used insulating material for a given voltage level under which the device is operating or being tested according to relevant standards. This distance can also influence phase displacement of the measured signal and thus it can improve phase error of the whole device. In order to provide the best electric field distribution between the upper shielding electrode 10 and the lower shielding electrode 11 (which may also be referred to as the high-voltage electrode 10 and the low-voltage electrode 11, respectively), the radius R of ends of said electrodes should be bigger (e.g., larger) than 0.5 mm. Distances E and C from the shielding electrodes 10 and 11 to the insulating body 2 should be bigger (e.g., larger) than a dielectric withstand of used insulating material for a given voltage level that the electrodes can be connected to. According to an exemplary embodiment, the distance, preferably, should be higher than 1 mm.

According to exemplary embodiments of the present disclosure, the bigger (e.g., larger) the dimensions B, R, E, and C are the better electric field distribution on the surface of the insulating body. Moreover, the bigger (e.g., larger) the dimensions A and D are the better electric field distribution on the impedance divider elements, thereby reducing the risk of partial discharges and dielectric breakdown.

The dimensions of the exemplary embodiments described herein, provide the best results, independently of how the device is implemented or where/how the device is used. In case of simple arrangements in applications or less complex structures with reduced possibility for external influences, a simplified structure of shielding electrodes could be used.

Figure 4:
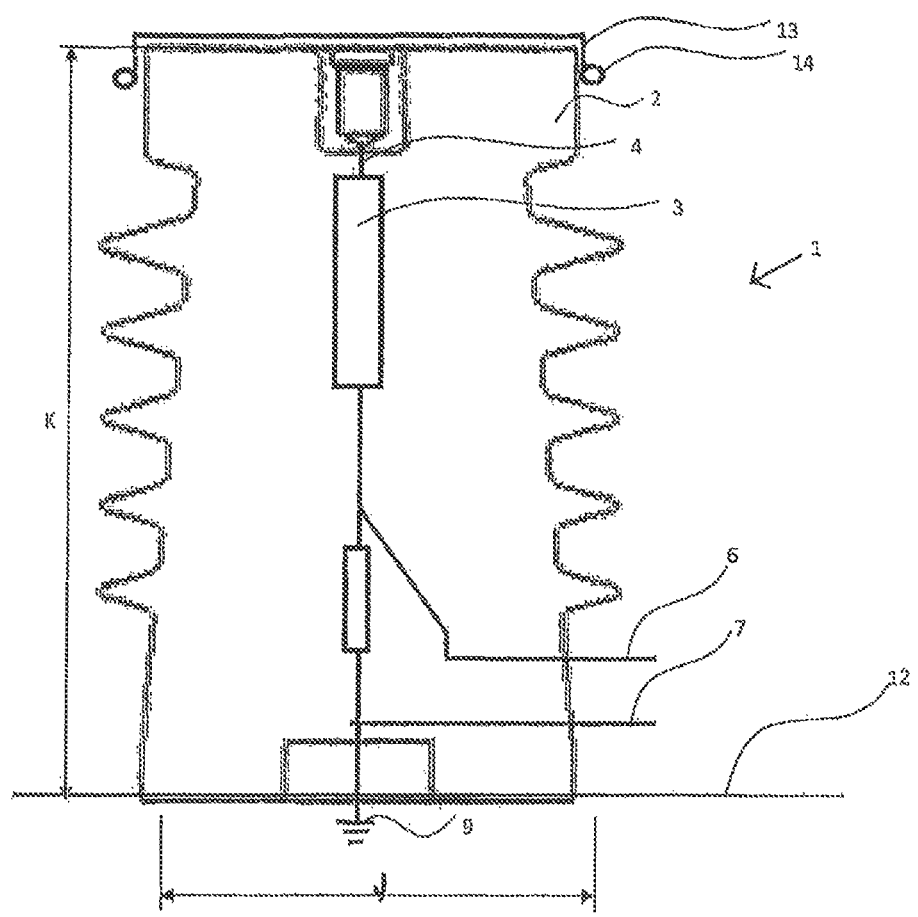
FIG. 4 illustrates a voltage sensor including an external electrode arrangement in accordance with an exemplary embodiment of the present disclosure.

FIG. 4 illustrates a second voltage sensor including an external electrode arrangement in accordance with an exemplary embodiment of the present disclosure. As shown in FIG. 4, the lower shielding electrode 11 could be omitted in cases, when the device 1 is mounted on electrically conductive material, such as a sheet of metal, which can have a bigger (e.g., larger) size than a diameter J of the insulating body 2. According to an exemplary embodiment of the present disclosure, if the height K of the insulating body 2 is smaller than two times the distance J and there is no other voltage source at a distance from insulating body 2 that is less than the distance K, the lower shielding electrode 11 can be omitted and replaced by baseplate 12 to which the device is mounted. This arrangement could achieve a good dielectric field distribution within the high voltage part and the ground, to which the baseplate 12 is usually connected.

According to another exemplary embodiment of the present disclosure, further simplification could be achieved in relation to the upper shielding electrode 10. The internal electrode 10 can be omitted under conditions in which the connection to a high voltage is made through a busbar, which has a width that is larger than an outer diameter L of an insulating body 2. In this case, the connected busbar can properly distribute the electric field and provide shielding against external influences. According to another exemplary embodiment in which a busbar is not used to connect to a high voltage, but rather connection is made via flexible material, the upper shielding electrode can be used. The internal upper electrode 10 can be omitted in exemplary embodiments in which an external electrode 13 is located at the top of the insulating body. To minimize dielectric stress coming from sharp edges of this electrode, the edges 14 of the external electrode 13 can be rounded (e.g., curved, smoothed) to a radius at least 0.5 mm, for example.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A voltage measurement device with an insulating body, for use in medium- or high-voltage equipment or switchgears, comprising:
   an impedance divider including at least one high-voltage impedance, at least one low-voltage impedance, and at least two shielding electrodes,
   wherein the at least one high-voltage impedance and the at least one low-voltage impedance are connected in series, provide a specified voltage division ratio, and together establish a physical length of the impedance divider,
   wherein the shielding electrodes include at least one high voltage shielding electrode and at least one low voltage shielding electrode,
   wherein the shielding electrodes are arranged to surround the at least one high-voltage impedance and the at least one low-voltage impedance,
   wherein an output of the impedance divider is connected to a shielded cable, and
   wherein the shielding electrodes are longer than a physical length of the high-voltage impedance and the low-voltage impedance surrounded by the shielding electrodes, such that a length of the high voltage shielding electrode is longer than a length of the high-voltage impedance and a length of the low voltage shielding electrode is longer than a length of the low-voltage impedance in order to sufficiently shield the whole high-voltage impedance and low-voltage impedance from external influences.

2. The voltage measurement device according to claim 1, wherein the shielding electrodes distribute the electric field and reduce electric field stress either inside or outside of the said device based on a location of the at least one high-voltage impedance and the at least one low-voltage impedance.

3. The voltage measurement device according to claim 1, wherein the at least one high-voltage impedance and the at least one low-voltage impedance are located inside the insulating body.

4. The voltage measurement device according to claim 1, wherein the shielding electrodes are in ring or bell shapes, having roundings at the edges with radius of at least 0.5 mm.

5. The voltage measurement device according to claim 1, wherein the shielding electrodes are located at least 1 mm internally from a surface of the insulating body.

6. The voltage measurement device according to claim 1, wherein a distance of the shielding electrodes from the impedance divider is larger than a distance that maintains the dielectric integrity of a material forming the insulating body for a voltage level under which the impedances are operating.

7. The voltage measurement device according to claim 1, wherein a distance between the shielding electrodes is larger than a distance that maintains the dielectric integrity of a material forming the insulating body for a voltage level which occurs in an area between said shielding electrodes.

8. The voltage measurement device according to claim 1, wherein the impedance divider is a resistive divider, a capacitive divider, or a combination thereof.

9. The voltage measurement device according to claim 1, wherein the shielded cable is a twisted pair or a double shielded cable for achieving an electric and magnetic field immunity for output from the device.

10. The voltage measurement device according to claim 1, wherein the shielded cable is a coaxial cable having a performance that reduces costs of the device as a whole.

11. The voltage measuring device according to claim 1, wherein the insulating body has at least one of a shape and a functionality of a post insulator, bushing, or cable plug.

12. The voltage measuring device according to claim 1, wherein the insulating body is a stand-alone voltage measurement module that is to be integrated into other devices.

* * * * *